(12) United States Patent
Yoo et al.

(10) Patent No.: US 12,098,461 B2
(45) Date of Patent: Sep. 24, 2024

(54) PLASMA SURFACE TREATMENT APPARATUS FOR CONDUCTIVE POWDER

(71) Applicant: KOREA INSTITUTE OF FUSION ENERGY, Daejeon (KR)

(72) Inventors: Seung Ryul Yoo, Daejeon (KR); Yong Sup Choi, Jeollabuk-do (KR); Yong Ho Jung, Gyeonggi-do (KR); Dong Chan Seok, Jeollabuk-do (KR); Kang Il Lee, Jeollabuk-do (KR)

(73) Assignee: KOREA INSTITUTE OF FUSION ENERGY, Daejeon (KR)

( * ) Notice: Subject to any disclaimer, the term of this patent is extended or adjusted under 35 U.S.C. 154(b) by 187 days.

(21) Appl. No.: 17/758,324

(22) PCT Filed: Jan. 22, 2021

(86) PCT No.: PCT/KR2021/000873
§ 371 (c)(1),
(2) Date: Jul. 1, 2022

(87) PCT Pub. No.: WO2021/150046
PCT Pub. Date: Jul. 29, 2021

(65) Prior Publication Data
US 2023/0038043 A1   Feb. 9, 2023

(30) Foreign Application Priority Data
Jan. 22, 2020  (KR) .................. 10-2020-0008341

(51) Int. Cl.
*C23C 16/44*   (2006.01)
*B01J 19/08*   (2006.01)
(Continued)

(52) U.S. Cl.
CPC .......... *C23C 16/4417* (2013.01); *B01J 19/088* (2013.01); *C23C 16/24* (2013.01); *C23C 16/513* (2013.01); *B01J 2219/0809* (2013.01)

(58) Field of Classification Search
None
See application file for complete search history.

(56) References Cited

U.S. PATENT DOCUMENTS 6,045,913 A * 4/2000 Castle ................. C03C 12/00
428/404
6,254,981 B1 * 7/2001 Castle ................. C03C 12/00
524/789
(Continued)

FOREIGN PATENT DOCUMENTS

KR   10-2009-0063538   6/2009
KR   10-2010-0051594   5/2010
KR   10-2014-0102488   8/2014

OTHER PUBLICATIONS

International Search Report and Written Opinion regarding International Application No. PCT/KR2021/000873, dated Jul. 29, 2021, 11 pages. (English translation).

*Primary Examiner* — Srinivas Sathiraju
(74) *Attorney, Agent, or Firm* — NORTON ROSE FULBRIGHT US LLP

(57) ABSTRACT

Disclosed is a plasma surface treatment apparatus for conductive powder. The plasma surface treatment apparatus for conductive powder comprises: a reaction chamber including a linear gas inlet at the lower end thereof and a gas outlet at the upper end thereof, and having a vertical cross section that is funnel-shaped; and a plasma jet generation device that is located below the linear gas inlet and is configured to discharge a plasma jet into the reaction chamber from below in an upward direction through the linear gas inlet, wherein
(Continued)

powder is accommodated in the reaction chamber and is treated by plasma while buoyed by the plasma jet.

20 Claims, 5 Drawing Sheets

(51) Int. Cl.
  *C23C 16/24* (2006.01)
  *C23C 16/513* (2006.01)

(56) References Cited

U.S. PATENT DOCUMENTS

| | | | | |
|---|---|---|---|---|
| 7,662,253 B2* | 2/2010 | Yoon | ............... | H05H 1/2406 |
| | | | | 156/345.43 |
| 7,735,935 B2* | 6/2010 | Vinegar | ............... | E21B 43/30 |
| | | | | 299/5 |
| 8,883,027 B2* | 11/2014 | Yoon | ............... | H01L 21/67069 |
| | | | | 156/345.43 |
| 9,211,510 B2* | 12/2015 | Enomura | ............... | B01F 23/53 |
| 9,994,683 B2* | 6/2018 | Gilliam | ............... | C08J 3/124 |
| 2003/0155111 A1* | 8/2003 | Vinegar | ............... | E21B 36/04 |
| | | | | 166/59 |
| 2004/0020642 A1* | 2/2004 | Vinegar | ............... | E21B 47/0224 |
| | | | | 166/245 |
| 2006/0029955 A1* | 2/2006 | Guia | ............... | G01N 33/48728 |
| | | | | 435/7.2 |
| 2007/0072432 A1* | 3/2007 | Yoon | ............... | H05H 1/2406 |
| | | | | 257/E21.252 |
| 2007/0209799 A1* | 9/2007 | Vinegar | ............... | E21B 43/305 |
| | | | | 166/302 |
| 2009/0209029 A1* | 8/2009 | Guia | ............... | B65B 31/00 |
| | | | | 435/288.7 |
| 2010/0108491 A1* | 5/2010 | Yoon | ............... | H01L 21/67069 |
| | | | | 204/164 |
| 2010/0126727 A1* | 5/2010 | Vinegar | ............... | B09C 1/06 |
| | | | | 166/302 |
| 2010/0155310 A1* | 6/2010 | Enomura | ............... | B22F 9/24 |
| | | | | 977/840 |
| 2010/0270015 A1* | 10/2010 | Vinegar | ............... | E21B 43/2401 |
| | | | | 166/272.1 |
| 2010/0304045 A1* | 12/2010 | Bisges | ............... | C23C 16/513 |
| | | | | 118/723 R |
| 2014/0190691 A1* | 7/2014 | Vinegar | ............... | C10G 9/24 |
| | | | | 166/272.1 |
| 2016/0039979 A1* | 2/2016 | Gilliam | ............... | C08J 3/24 |
| | | | | 525/303 |
| 2016/0045841 A1* | 2/2016 | Kaplan | ............... | C01B 32/05 |
| | | | | 429/49 |
| 2020/0402810 A1* | 12/2020 | Seok | ............... | H01J 37/3244 |
| 2022/0288676 A1* | 9/2022 | Cauchy | ............... | C04B 35/16 |
| 2023/0038043 A1* | 2/2023 | Yoo | ............... | C23C 16/442 |

\* cited by examiner

<SURFACE EDS MAPPING BEFORE MCMB (GRAPHITE) TREATMENT>

<HMDSO Plasma Treated MCMB (Graphite) EDS mapping>

PLASMA SURFACE TREATMENT APPARATUS FOR CONDUCTIVE POWDER

CROSS-REFERENCE TO RELATED APPLICATIONS

This application a national phase under 35 U.S.C. § 371 of International Application No. PCT/KR2021/000873, filed Jan. 22, 2021, which claims priority to Korean Patent Application No. 10-2020-0008341, filed Jan. 22, 2020, with the Korean Intellectual Property Office. The contents of each of the referenced applications are incorporated into the present application by reference.

FIELD OF THE INVENTION

The present disclosure relates to a plasma surface treatment apparatus for powder, and more specifically, to a plasma surface treatment apparatus for conductive powder that performs a surface treatment with a plasma jet while stirring the conductive powder well so as not to be located between two electrodes.

DESCRIPTION OF RELATED ART

Conventionally, it is common that a surface treatment of powder is performed while the powder passes through a path insulated from an electrode where plasma exists, or the surface treatment of the powder is performed as a carrier gas circulates along a circulation path and the plasma exists in the path so as to circulate the powder along the path along which the carrier gas circulates.

However, such method for the surface treatment of the powder does not stir the powder evenly when a volume of an apparatus increases or when the powder flows along the path. That is, the powder flows only in one direction when flowing along the path, so that the powder is not able to be stirred evenly as some of the powder flows in a clustered form.

In addition, the surface treatment of the conductive powder was difficult. Because when the conductive powder exists between the electrodes for plasma generation, electrical interference between the electrodes for the plasma generation and the conductive powder occurs by the conductive powder, making it difficult to generate the plasma.

Therefore, conventional technologies for the surface treatment of the conductive powder have no choice but to perform the treatment in a reactor in which the electrode exists on an outer face thereof. In this case, the plasma generated in the reactor may have a low density. The surface treatment of the powder in such a plasma environment takes a long time and has a difficulty in uniformly treating the surface of powder.

As such, a technology for suspending the powder when the surface treatment of the powder is performed in the reactor is attempted so as to achieve uniform surface treatment of the powder, but this is nothing more than dispersing the powder. In addition, because the surface treatment of the powder is performed in the plasma environment with the low density, the uniform surface treatment of the powder is still difficult.

SUMMARY OF THE INVENTION

Therefore, the present disclosure is to provide a plasma surface treatment apparatus for conductive powder that enables uniform surface treatment of the conductive powder by allowing the conductive powder to be in direct contact with a plasma jet while being stirred well via suspension and falling by gravity for a certain period of time.

One aspect of the present disclosure provides a plasma surface treatment apparatus for powder including a reaction chamber including a linear gas inlet defined at a lower end thereof and a gas outlet formed at an upper end thereof, wherein the reaction chamber has a vertical cross-section in a form of a funnel, and a plasma jet generator positioned below the linear gas inlet, wherein the plasma jet generator is constructed to discharge a plasma jet into the reaction chamber through the linear gas inlet in an upward direction, wherein the powder is accommodated in the reaction chamber and is treated by plasma while being suspended by the plasma jet.

In one implementation of the plasma surface treatment apparatus, the powder may be conductive powder and the conductive powder may be carbon particles.

The present disclosure has a technical feature of allowing the conductive powder to come into direct contact with the plasma jet while being stirred well via the process of being suspended via the plasma jet and then falling by the gravity in order to achieve a goal of uniformly treating the surface of the powder as the conductive powder is in direct contact with the plasma while being stirred well without being placed between the electrodes for the plasma generation in treating the conductive powder.

In one implementation of the plasma surface treatment apparatus, the plasma jet may be a plasma jet of nitrogen or air, and the conductive powder may be subjected to a hydrophilic surface treatment.

In one implementation of the plasma surface treatment apparatus, the plasma surface treatment apparatus further includes a linear gas injection port capable of injecting an additional gas between the gas inlet and the plasma jet generator such that the additional gas is discharged into the reaction chamber together with the plasma jet from the linear gas inlet.

In one implementation of the plasma surface treatment apparatus, the linear gas injection port may be composed of two inlets defined at both sides thereof to face each other so as to be merged with the gas inlet.

In one implementation of the plasma surface treatment apparatus, the additional gas may contain a liquid precursor and a carrier gas.

In one implementation of the plasma surface treatment apparatus, the additional gas may contain a material to be coated on the conductive powder, and the conductive powder may be coated with the material to be coated.

In one implementation of the plasma surface treatment apparatus, the additional gas may contain one selected from a group consisting of hexamethyldisiloxane (HMDSO), tetraethyl orthosilicate (TEOS), and tetramethylsilane (TMS), and a carrier gas, and the conductive powder may be coated with silicon.

In one implementation of the plasma surface treatment apparatus, the plasma jet generator may be a DBD apparatus including two electrodes facing each other while being spaced apart from each other by a certain spacing to define a linear gap, voltage applying means for applying a voltage to the two electrodes so as to generate the plasma between the two electrodes, and a discharge gas inlet for generating the plasma jet for injecting a plasma discharge gas between the two electrodes, the linear gap between the two electrodes of the plasma jet generator may be defined below the linear gas inlet in a longitudinal direction of the linear gas inlet.

In one implementation of the plasma surface treatment apparatus, a size of the linear gap may be in a range from 0.1 to 2 mm.

In one implementation of the plasma surface treatment apparatus, the gas outlet may have a filter constructed such that the powder is not able to pass therethrough and only a gas is able to pass therethrough.

According to the plasma surface treatment apparatus for the conductive powder of the present disclosure, the entirety of the powder may be uniformly subjected to the plasma treatment as the surface of the powder is repeatedly in contact with the plasma jet while the powder is stirred well by repeating the suspension by the plasma jet and the falling by the gravity.

DETAILED DESCRIPTION OF THE INVENTION

Figure 1:
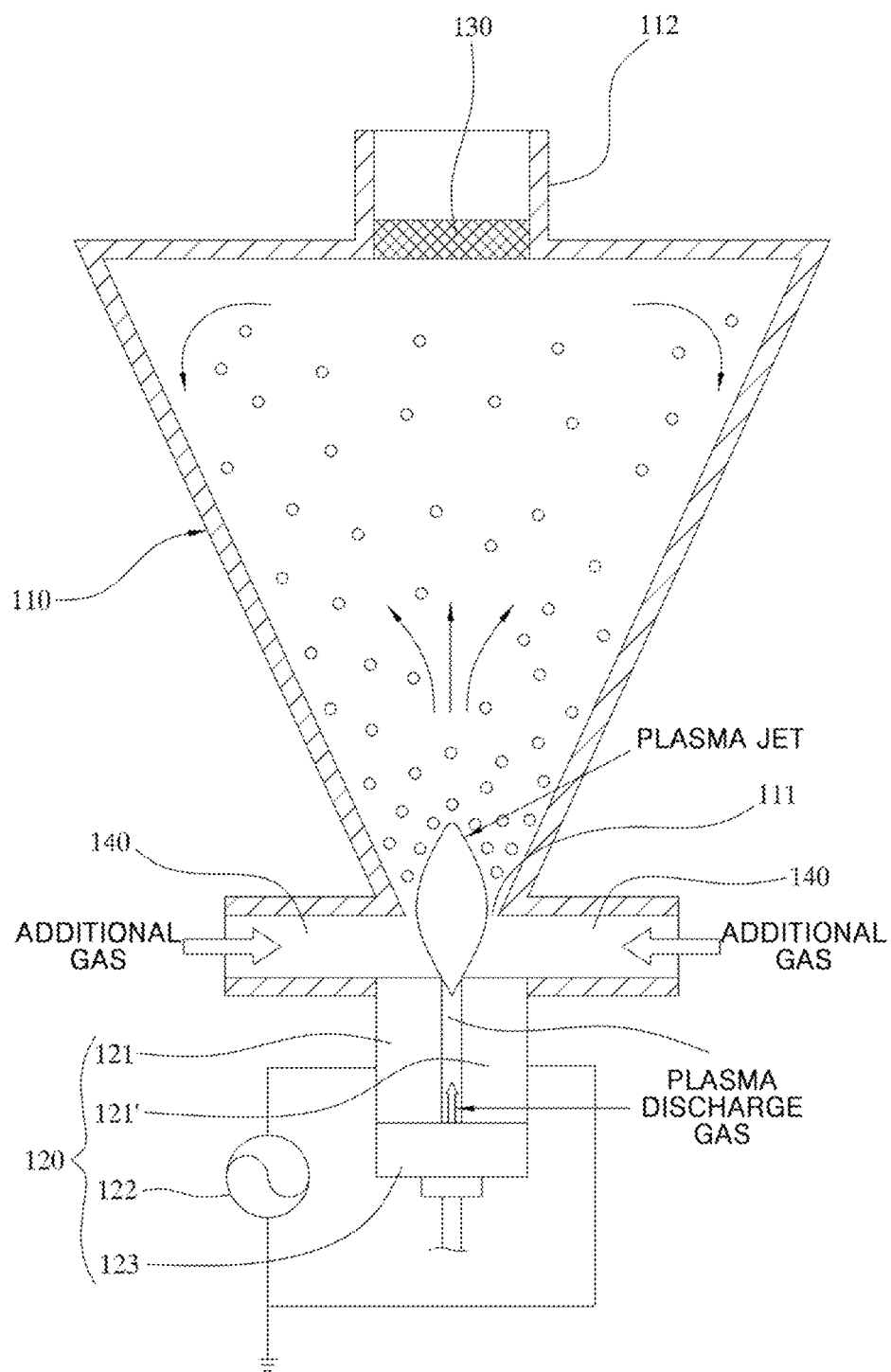
FIG. 1 is a cross-sectional view showing a configuration of a plasma surface treatment apparatus for conductive powder according to an embodiment of the present disclosure.

Hereinafter, a plasma surface treatment apparatus for conductive powder according to an embodiment of the present disclosure will be described in detail with reference to the accompanying drawings. The present disclosure may be variously modified and may take many forms. Thus, specific embodiments will be illustrated in the drawings and described in detail herein. However, the specific embodiments are not intended to limit the present disclosure thereto. It should be understood that all changes, equivalents thereto, or substitutes therewith are included in a scope and spirit of the present disclosure. In describing the drawing, similar reference numerals are used for similar components. In the accompanying drawings, dimensions of structures are enlarged than actual dimensions for clarity of the present disclosure.

Terms such as first, second, and the like may be used to describe various components, but the components should not be limited by the terms. The above terms are used only for the purpose of distinguishing one component from another. For example, without departing from the scope of the present disclosure, the first component may be named as the second component, and similarly, the second component may also be named as the first component.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or greater other features, integers, operations, elements, components, and/or portions thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
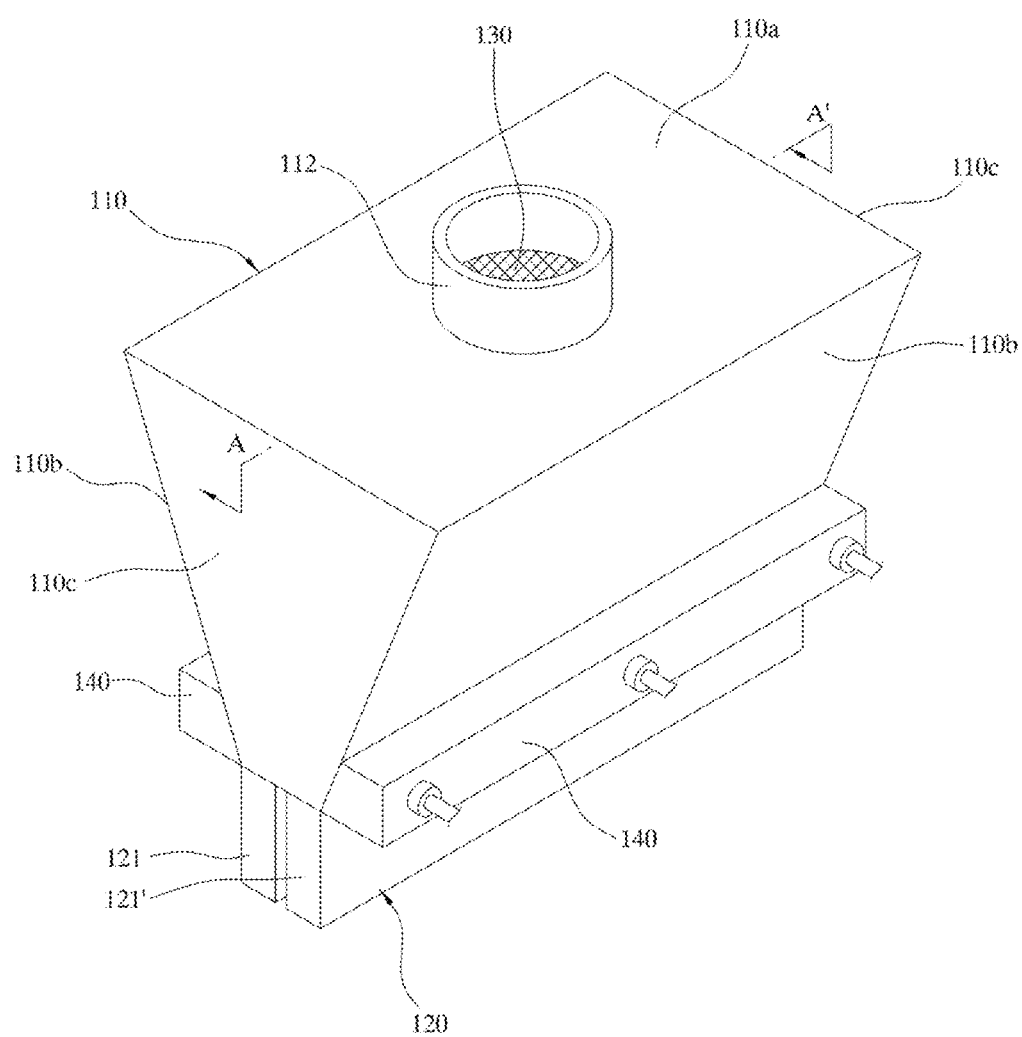
FIG. 2 is a perspective view showing an appearance of a plasma surface treatment apparatus for conductive powder according to an embodiment of the present disclosure.
Figure 3:
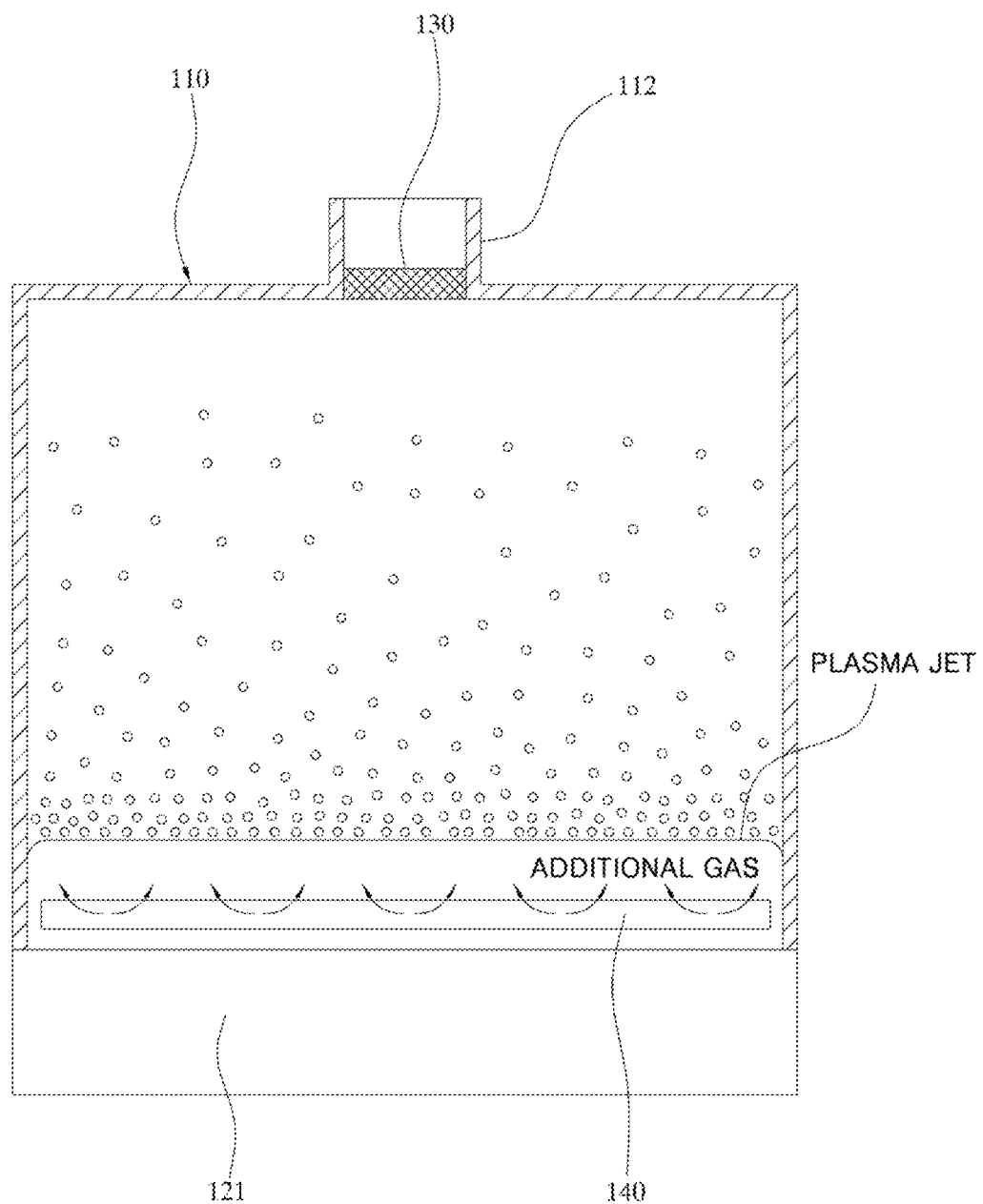
FIG. 3 is a cross-sectional view taken along a line A-A' in FIG. 2.

FIG. 1 is a cross-sectional view showing a configuration of a plasma surface treatment apparatus for conductive powder according to an embodiment of the present disclosure, FIG. 2 is a perspective view showing an appearance of a plasma surface treatment apparatus for conductive powder according to an embodiment of the present disclosure, and FIG. 3 is a cross-sectional view taken along a line A-A' in FIG. 2.

Referring to FIGS. 1 to 3, a plasma surface treatment apparatus for conductive powder according to an embodiment of the present disclosure may include a reaction chamber 110 and a plasma jet generator 120.

The reaction chamber 110 is formed such that a vertical cross-section thereof has a funnel shape. For example, the reaction chamber 110 may include a rectangular-shaped flat face 110*a*, two guide side faces 110*b* tapered in a downward direction from two opposite sides of the rectangular shape of the flat portion 110*a*, and finishing side faces 110*c* respectively disposed on both sides of each guide side portion 110*b*. When the two guide side portions 110*b* are cut vertically, the cross-section of the funnel shape may be represented.

Powder to be treated is accommodated in such reaction chamber 110. The powder to be treated may be conductive powder, and the conductive powder may be carbon particles.

A linear gas inlet 111 is defined at a lower end of the funnel shape, and a gas outlet 112 is formed at an upper end of the funnel shape.

The linear gas inlet 111, as an opening extending linearly, may have a length corresponding to a length of a lower end of the guide side face 110*b*, and may be located at the lower end of the guide side face 110*b*.

The gas outlet 112 is formed at the upper end of the reaction chamber 110 and allows a gas flowing into the reaction chamber 110 to be discharged. A shape of the gas outlet 112 is not particularly limited. For example, the gas outlet 112 may have a cylindrical shape. In such gas outlet 112, a filter 130 that filters impurities, for example, substances that may contaminate an environment, contained in the gas discharged from the reaction chamber 110 and is constructed such that the powder is not able to pass therethrough and only a gas is able to pass therethrough.

The plasma jet generator 120 may be located below the linear gas inlet 111 of the reaction chamber 110 and may be constructed to discharge the plasma jet into the reaction chamber 110 through the linear gas inlet 111 in an upward direction. Such plasma jet generator 120 may be a dielectric barrier discharge (DBD) apparatus including two electrodes 121 and 121', voltage applying means 122, and a discharge gas inlet 123.

At a location below the linear gas inlet 111 of the reaction chamber 110, the two electrodes 121 and 121' may face each other while being spaced apart from each other by a certain spacing to define a linear gap 121a, and the two electrodes 121 and 121' and the linear gap 121a may have a length corresponding to a length of the linear gas inlet 111. A size of the linear gap may be in a range from 0.1 to 2 mm.

The voltage applying means 122 applies a voltage to the two electrodes 121 and 121' such that plasma is generated between the two electrodes 121 and 121'.

The discharge gas inlet 123 injects plasma discharge gas between the two electrodes 121 and 121'. That is, the discharge gas inlet 123 is disposed beneath the two electrodes 121 and 121' and injects the plasma discharge gas in the upward direction from below the two electrodes 121 and 121'. In this regard, an injection pressure of the plasma discharge gas may be a pressure capable of suspending the powder accommodated in the reaction chamber. A shape of the discharge gas inlet 123 is not particularly limited, and any structure capable of evenly injecting the plasma discharge gas into the linear gap 121a of the two electrodes 121 and 121' is possible. For example, the plasma discharge gas may be oxygen and an inert gas, such as nitrogen, argon, or helium.

Such plasma jet generator 120 suspends the powder accommodated in the reaction chamber 110 while the plasma discharge gas is injected, and allows the powder falling toward the linear gap 121a between the two electrodes 121 and 121' to be in contact with the plasma jet.

Hereinafter, a process in which the powder is treated in the plasma surface treatment apparatus for the conductive powder according to an embodiment of the present disclosure will be described.

The powder to be treated is accommodated inside the reaction chamber 110. The plasma discharge gas is injected into the linear gap 121a between the two electrodes 121 and 121' of the plasma jet generator 120 through the discharge gas inlet 123. As the voltage is applied such that the plasma is generated between the two electrodes 121 and 121', the plasma jet is generated by the plasma discharge gas injected into the linear gap 121a. The plasma jet is discharged in the upward direction, that is, from the linear gas inlet 111 at a lower end of the reaction chamber 110 to the inside of the reaction chamber 110. At this time, a plasma reaction gas is also discharged into the reaction chamber 110 in the upward direction.

The plasma jet discharged in the upward direction is in contact with the powder, so that the surface treatment of the powder is performed. The plasma reaction gas discharged in the upward direction suspends the powder inside the reaction chamber 110 in a direction toward the upper end of the reaction chamber 110.

Subsequently, the suspended powder falls in a direction toward the lower end of the reaction chamber 110. At this time, because the reaction chamber 110 has the funnel shape, the powder falls by being guided in a direction of the linear gas inlet 111 via the two guide side faces 110b of the reaction chamber 110. The powder falling as such comes into contact with the plasma jet again and is subjected to the surface treatment.

Such process is repeated while the plasma jet and the plasma discharge gas are discharged, and the powder is stirred well while repeating the suspension and the falling. As a surface of the powder is in contact with the plasma jet repeatedly, an entirety of the surface of the powder may be uniformly subjected to the plasma treatment.

In such plasma treatment of the powder, the powder may be the carbon particles, and the carbon particles may be subjected to a hydrophilic surface treatment.

Example 1

The carbon particles were subjected to the hydrophilic surface treatment using the plasma surface treatment apparatus for the conductive powder according to one embodiment of the present disclosure.

In this regard, plasma power was 0.4 kW, 101 pm of nitrogen and 0.51 pm of oxygen were injected as the plasma reaction gas, and 2 grams of the carbon particles were added to perform the hydrophilic surface treatment of the carbon particles while repeating the process of the suspension, the falling, and the contact with the plasma jet of the carbon particles for 5 minutes.

After the hydrophilic surface treatment of the carbon particles, hydrophilicity was observed by adding the carbon particles to purified water (D.I water).

Figure 4:
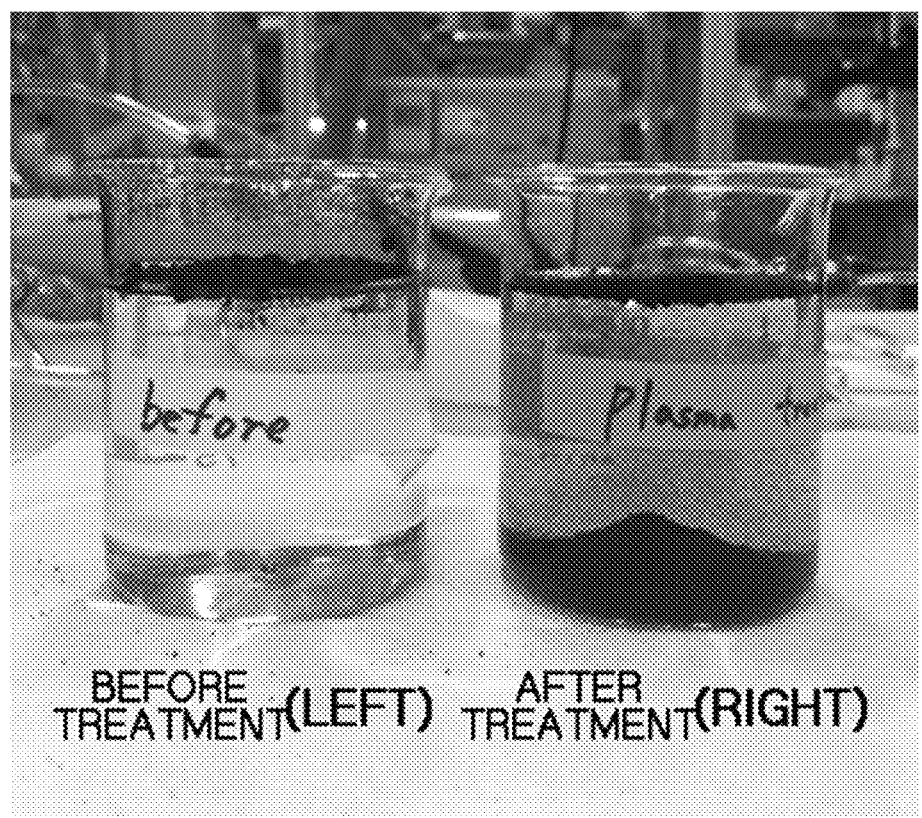
FIG. 4 shows conductive powder in purified water that was subjected to a hydrophilic surface treatment after a surface treatment of the conductive powder according to Example 1.

As a result, it was identified that the carbon particles were subjected to the hydrophilic surface treatment by identifying that the carbon particles after the surface treatment were submerged in the purified water as shown in FIG. 4. FIG. 4 shows conductive powder in purified water that was subjected to a hydrophilic surface treatment after a surface treatment of the conductive powder according to Example 1.

In the case of the surface treatment of the carbon particles as in [Example 1], it is preferable to supply less than 1% by volume of the oxygen with respect to a volume of the nitrogen so as to prevent oxidation of the carbon particles.

In one example, the plasma surface treatment apparatus for the conductive powder according to an embodiment of the present disclosure may further include a linear gas injection port 140.

The linear gas injection port 140 is constructed to be able to inject an additional gas between the linear gas inlet 111 and the plasma jet generator 120 such that the additional gas is discharged into the reaction chamber 110 together with the plasma jet from the linear gas inlet 111.

Such linear gas injection port 140 may be disposed between the linear gas inlet 111 and the linear gap 121a of the two electrodes 121 and 121' of the plasma jet generator 120, and may include two inlets arranged to face each other such that the additional gas to be injected from both sides of the linear gas inlet 111 is merged at the linear gas inlet 111. A plurality of linear gas injection ports 140 may be arranged along a longitudinal direction of the linear gas inlet 111.

The additional gas injected via the linear gas injection port 140 may contain a liquid precursor and a carrier gas, and may contain a material to be coated on the conductive powder. That is, the liquid precursor may contain the material to be coated. The carrier gas may be air.

For example, the additional gas may contain one selected from a group consisting of HVDSO, TEOS, and TMS, and the carrier gas.

Therefore, the plasma surface treatment apparatus for the conductive powder according to an embodiment of the present disclosure may inject the additional gas together with the plasma jet via the linear gas injection port 140 during the treatment of the powder to coat the surface of the powder.

Example 2

Silicon coating was performed on surfaces of the carbon particles using the plasma surface treatment apparatus for the conductive powder according to an embodiment of the present disclosure.

In this regard, the plasma power, the supply of the plasma reaction gas, the amount of carbon particles, the type of the plasma reaction gas, and the process progress time were the same as those in Example 1. A HMDSO liquid precursor was bubbled with the nitrogen via the linear gas injection port and supplied as the additional gas.

Figure 5:
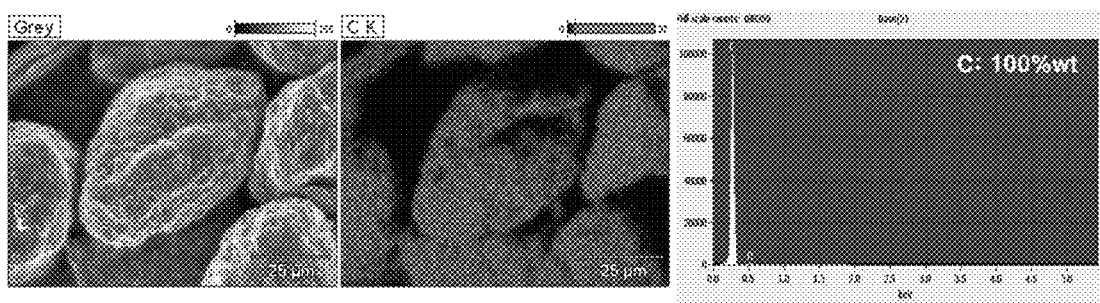
FIG. 5 shows an EDS mapping result before a surface treatment of conductive powder and an EDS mapping result after the surface treatment of the conductive powder according to Example 2.
Figure 5:
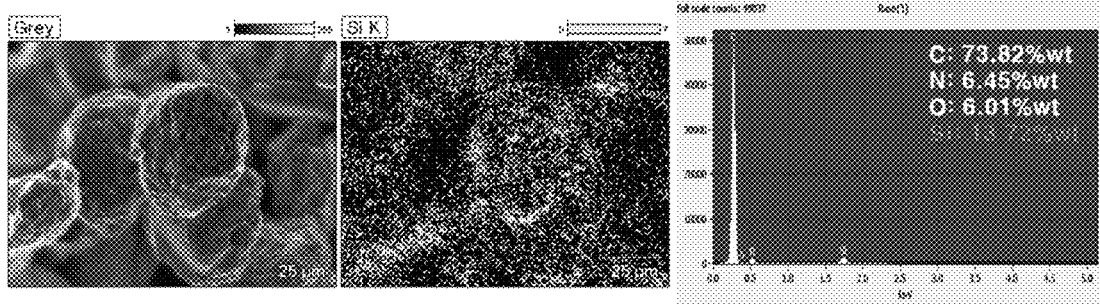

As a result, it was identified that, although the powder does not contain silicon before the surface treatment of the powder in FIG. 5, a silicon functional groups was formed after performing the surface treatment by injecting the additional gas. FIG. 5 shows an energy-dispersive X-ray spectroscopy (EDS) mapping result before a surface treatment of conductive powder and an EDS mapping result after the surface treatment of the conductive powder according to Example 2.

When the plasma surface treatment apparatus for the conductive powder according to an embodiment of the present disclosure is used, as the powder is stirred well by repeating the suspension by the plasma jet and the falling by gravity and the surface of the powder is repeatedly in contact with the plasma jet, the entirety of the surface of the powder may be uniformly subjected to the plasma treatment.

In addition, because the powder falling after the suspension does not fall between the two electrodes 121 and 121', but is suspended at the same time when being in contact with the plasma jet, inflow of the conductive powder between the two electrodes 121 and 121' is blocked, so that, while treating the conductive powder, the formation of the plasma jet between the two electrodes 121 and 121' may be performed stably without interference or error. In addition, because the surface of the conductive powder is in direct contact with the plasma jet, imparting of the hydrophilicity to the conductive powder and thin-film coating on the surface of the conductive powder may be effectively performed.

The presented descriptions of the embodiments are provided such that any person with ordinary skill in the technical field of the present disclosure may use or practice the present disclosure. Various modifications to such embodiments will be apparent to those skilled in the art of the present disclosure. The general principles defined herein may be applied to other embodiments without departing from the scope of the present disclosure. Thus, the present disclosure should not be limited to the embodiments presented herein, but should be interpreted to the widest scope consistent with the principles and novel features presented herein.

What is claimed is:

1. A plasma surface treatment apparatus for powder, the plasma surface treatment apparatus comprising:
a reaction chamber including a linear gas inlet defined at a lower end thereof and a gas outlet formed at an upper end thereof, wherein the reaction chamber has a vertical cross-section in a form of a funnel; and
a plasma jet generator positioned below the linear gas inlet, wherein the plasma jet generator is constructed to discharge a plasma jet into the reaction chamber through the linear gas inlet in an upward direction,
wherein the plasma jet generator comprises two electrodes facing each other and spaced apart from each other by a spacing to define a linear gap,
wherein the two electrodes and the linear gap have a length corresponding to a length of the linear gas inlet, and
wherein the powder is accommodated in the reaction chamber and is treated by plasma while being suspended by the plasma jet.

2. The plasma surface treatment apparatus of claim 1, wherein the powder is conductive powder.

3. The plasma surface treatment apparatus of claim 2, wherein the conductive powder is carbon particles.

4. The plasma surface treatment apparatus of claim 3, further comprising a linear gas injection port capable of injecting an additional gas between the gas inlet and the plasma jet generator such that the additional gas is discharged into the reaction chamber together with the plasma jet from the linear gas inlet.

5. The plasma surface treatment apparatus of claim 3, wherein the gas outlet has a filter constructed such that the powder is not able to pass therethrough and only a gas is able to pass therethrough.

6. The plasma surface treatment apparatus of claim 2, wherein the plasma jet is a plasma jet of nitrogen or air,
wherein the conductive powder is subjected to a hydrophilic surface treatment.

7. The plasma surface treatment apparatus of claim 6, further comprising a linear gas injection port capable of injecting an additional gas between the gas inlet and the plasma jet generator such that the additional gas is discharged into the reaction chamber together with the plasma jet from the linear gas inlet.

8. The plasma surface treatment apparatus of claim 2, further comprising a linear gas injection port capable of injecting an additional gas between the gas inlet and the plasma jet generator such that the additional gas is discharged into the reaction chamber together with the plasma jet from the linear gas inlet.

9. The plasma surface treatment apparatus of claim 2, wherein the gas outlet has a filter constructed such that the powder is not able to pass therethrough and only a gas is able to pass therethrough.

10. The plasma surface treatment apparatus of claim 1, further comprising a linear gas injection port capable of injecting an additional gas between the gas inlet and the plasma jet generator such that the additional gas is discharged into the reaction chamber together with the plasma jet from the linear gas inlet.

11. The plasma surface treatment apparatus of claim 10, wherein the linear gas injection port is composed of two inlets defined at both sides thereof to face each other so as to be merged with the gas inlet.

12. The plasma surface treatment apparatus of claim 10, wherein the additional gas contains a liquid precursor and a carrier gas.

13. The plasma surface treatment apparatus of claim 10, wherein the additional gas contains a material to be coated on the conductive powder,
wherein the conductive powder is coated with the material to be coated.

14. The plasma surface treatment apparatus of claim 13, wherein the additional gas contains one selected from a group consisting of hexamethyldisiloxane, tetraethyl orthosilicate, and tetraethyl orthosilicate, and a carrier gas,
wherein the conductive powder is coated with silicon.

15. The plasma surface treatment apparatus of claim 13, wherein the additional gas contains hexamethyldisiloxane.

16. The plasma surface treatment apparatus of claim 13, wherein the additional gas contains tetraethyl orthosilicate.

17. The plasma surface treatment apparatus of claim 13, wherein the additional gas contains tetramethylsilane.

18. The plasma surface treatment apparatus of claim 1, wherein the plasma jet generator is a dielectric barrier discharge apparatus including:
two electrodes facing each other while being spaced apart from each other by a certain spacing to define a linear gap;

voltage applying means for applying a voltage to the two electrodes so as to generate the plasma between the two electrodes; and a discharge gas inlet for generating the plasma jet for injecting a plasma discharge gas between the two electrodes, wherein the linear gap between the two electrodes of the plasma jet generator is defined below the linear gas inlet in a longitudinal direction of the linear gas inlet.

19. The plasma surface treatment apparatus of claim 18, wherein a size of the linear gap is in a range from 0.1 to 2 mm.

20. The plasma surface treatment apparatus of claim 1, wherein the gas outlet has a filter constructed such that the powder is not able to pass therethrough and only a gas is able to pass therethrough.

* * * * *